United States Patent [19]

O et al.

[11] Patent Number: 4,829,359
[45] Date of Patent: May 9, 1989

[54] CMOS DEVICE HAVING REDUCED SPACING BETWEEN N AND P CHANNEL

[75] Inventors: Kenneth K. O, Cambridge, Mass.; Lawrence G. Pearce, Palm Bay; Dyer A. Matlock, Melbourne, both of Fla.

[73] Assignee: Harris Corp., Melbourne, Fla.

[21] Appl. No.: 55,558

[22] Filed: May 29, 1987

[51] Int. Cl.⁴ .............................................. H01L 27/02
[52] U.S. Cl. ........................................ 357/42; 357/49; 357/86
[58] Field of Search ...................... 357/42, 49, 86, 50

[56] References Cited

U.S. PATENT DOCUMENTS

| | | | |
|---|---|---|---|
| 4,399,605 | 8/1983 | Dash et al. | 357/42 |
| 4,507,846 | 4/1985 | Ohno | 357/42 |
| 4,633,289 | 12/1986 | Chen | 357/42 |
| 4,677,735 | 7/1987 | Malhi | 357/42 |
| 4,778,775 | 10/1988 | Tzeng | 357/42 |

FOREIGN PATENT DOCUMENTS

| | | | |
|---|---|---|---|
| 94670 | 7/1981 | Japan | 357/42 |
| 56-105663 | 8/1981 | Japan | 357/42 |

Primary Examiner—Andrew J. James
Assistant Examiner—Mark Prenty
Attorney, Agent, or Firm—Antonelli, Terry & Wands

[57] ABSTRACT

The separation constraint between the respective junctions formed between the drain regions of the complementary transistors and the semiconductor material in which they are formed is obviated by a structure which permits the respective drain regions of the opposite conductivity type transistors to have a reduced (effecting to zero) mutual separation and, at the same time, prevent the depletion regions fomed between the junctions defined by these source regions and the semiconductor material in which they are formed from spreading into contact with one another and thereby shorting the transistors together. This objective is achieved by a structure in which the source regions of the respective P and N channel transistors are formed so as to directly abut against one another and to be contiguous with a layer of buried dielectric isolation therebeneath. The buried dielectric layer extends from the bottom portions of the drain regions to a prescribed depth in each of the P-well region and the N-type substrate, so as to effectively provide a barrier between depletion region associated with the junction defined by the P well and N substrate the depletion regions formed between the N+ drain region and the P-well and the P+ drain region and the N-type substrate.

17 Claims, 7 Drawing Sheets

CMOS DEVICE HAVING REDUCED SPACING BETWEEN N AND P CHANNEL

FIELD OF THE INVENTION

The present invention relates to semiconductor devices and is particularly directed to an improved semiconductor structure in which the depth of surface regions is controlled and the spacing between the transistors in a complementary architecture is reduced.

BACKGROUND OF THE INVENTION

Integrated circuit architectures comprising complementary types of devices, such as the opposite conductivity type regions of CMOS circuit structures, may typically contain one polarity type of device in the semiconductor bulk, while a second polarity type of device is contained in a well region, the well region having a conductivity type opposite to that of the substrate in which the well is formed, so that the well region defines a PN junction with the opposite conductivity type semiconductor material of the bulk. An example of a CMOS circuit comprising this configuration is an inverter circuit, typically employed in present day digital/signal processing logic architectures, having opposite conductivity channel type transistors.

A schematic diagram of such a complementary channel type transistor logic circuit is shown in FIG. 1 as comprising an N channel MOS transistor 13 and a P channel MOS transistor 14. The gates of transistors 13 and 14 are connected in common to an input line 11, while the drain electrodes thereof are connected in common to an output electrode 12. The source of P channel transistor 14 is connected to the body of transistor 14 and to a positive polarity power supply ($+V_{DD}$) link 15, while the source of N channel transistor 13 is connected to the body of transistor 13 and to a negative power supply ($-V_{SS}$) link 16.

The semiconductor architectural configuration of the complementary MOS transistor pair of the circuit of FIG. 1 may be formed as a planar structure wherein field and gate oxide layers are formed atop an effectively planar substrate surface as illustrated in FIG. 2, or as a non-planar structure such as one employing local oxidation isolation as illustrated in FIG. 3.

In the planar configuration of FIG. 2, an N channel transistor 13 is disposed in a P-well region 23 that has been formed adjacent a top surface 21 of an N-type planar substrate 20. P-well region 23 forms a PN junction 22 with the N-type material of the substrate 20. Disposed in the P well region 23 are a pair of N+ regions 27 and 28 which form the respective source and drain regions of the N-channel transistor 13. Overlying the channel path between regions 27 and 28 is a thin layer of gate dielectric 41 (e.g. silicon dioxide), atop which is disposed a gate electrode layer 42. Also formed in P-well region 23 is a P+ well contact region 26. By way of respective openings or vias in a passivating dielectric (e.g. silicon dioxide) layer 25 disposed atop the surface 21 of substrate 20, electrode contacts 46 and 47 for regions 26 and 27 are provided. Each of these contacts is connected by way of a line 16 to one polarity ($-V_{SS}$) of the power supply for the complementary transistor pair, as schematically illustrated in FIG. 1 and diagrammatically shown in FIG. 2.

The P channel transistor 14 is formed of a pair of P+ regions 37 and 38 disposed adjacent to surface 21 of substrate 20, proper, regions 37 and 38 respectively constituting the source and drain regions of the P channel transistor 14. Region 38 is connected by way of an overlying contact metallization layer 48 to the region 28 of the N channel transistor 13, and to output line 12. Source region 37 is coupled via contact 57 to power supply ($+V_{DD}$) link 15 and, via contact metallization 56, to an N+ substrate contact region 36. A thin layer of gate dielectric material (e.g. gate oxide) 51 is disposed on the planar surface 21 overlying the channel path between regions 37 and 38 and a gate electrode layer 52 is provided on the gate dielectric layer 51. Gate electrode layers 42 and 52 of respective transistors 13 and 14 may comprise a metallic layer or a doped polysilicon layer. The respective gates of the transistors 13 and 14 are connected y way of gate contacts 43 and 53 to input link 11. If, on the other hand, and as is often the case, the gates are formed from one continuous line of gate material, only one contact to the input link is needed.

The embodiment of a non-planar structure shown in FIG. 3 is substantially the same as that of FIG. 2, except that, in place of field oxide layer 25 atop surface 21, a recessed dielectric isolation layer 35 has been formed, for example, by local oxidation. Layer 35 extends beneath the surface 21 of the substrate to provide oxide isolation adjacent the respective regions of the device structure.

One of the limitations of the CMOS architecture shown in FIGS. 2 and 3 is the surface occupation area or spacing between N+ drain region 28 of the N channel transistor 13 and P+ drain region 38 of the P channel transistor 14. More specifically, the N+ material of drain region 28 of N channel transistor 13 forms a PN junction 61 with the P material of P well region 23. Similarly, the P+ material of drain region 38 of P channel transistor 14 forms a PN junction 63 with the N-type material of substrate 20. Because of the creation of a depletion region which extends from these PN junctions towards the depletion region that extends from the PN junction 22 between the P well region 23 and the substrate 20, it is necessary to provide a spacing d2 between PN junction 63, defined between drain region 38 and the substrate 20, and the PN junction 22, defined between the well region 23 and the substrate 20, proper. Similarly, it is necessary to space the drain region 28 of the N-channel transistor 13, which forms a PN junction 61 with the P well region 23, from the PN junction 22 by a distance dl. These spacings d1 and d2 will be determined by the characteristics of the regions and the operational parameters of the device. What is important is that if the spacings dl and d2 are too small, the depletion regions which extend from PN junctions 22, 61 and 63 may touch each other, resulting in a shorting of the N+ drain region 28 of N channel transistor 13 to the N-substrate 20 and/or a shorting of the P+ drain region 38 of P channel transistor 14 with the P well region 23. Typically, spacings d1 and d2 are on the order of 1-4 μm. As a result of this spacing constraint, the circuit occupation area of the CMOS structure is necessarily large. The large area, in turn, results in the length of the overall wiring for the integrated circuit structure containing such circuits and the parasitic effects associated with such wiring being quite large.

SUMMARY OF THE INVENTION

In accordance with the present invention, the spacing or separation constraint between the respective PN junctions formed between the drain regions of complementary transistors and the semiconductor material in which they are formed is obviated by a structure which permits respective drain regions of opposite conductivity type transistors to have a reduced (down to zero) mutual separation and, at the same time, prevents depletion regions formed between the PN junctions defined by these drain regions and the semiconductor material in which they are formed from spreading into contact with one another and thereby shorting the transistors together.

This objective of the invention is achieved by a structure in which the drain regions of the respective P and N channel transistors are formed so as to directly abut against one another and to be contiguous with a region of buried dielectric isolation therebeneath. This buried dielectric region is disposed at a prescribed depth from the surface of the substrate so as to define the location of bottom portions of the drain regions (i.e. depths) in each of the P-well region and the N-type substrate. The buried dielectric region effectively provides a barrier between the depletion region associated with the PN junction defined by the P well and N substrate and the depletion region formed between the N+ drain region and the P-well and the P+ drain region and the N-type substrate. Because the drain regions of the opposite channel conductivity type transistors directly abut against one another, the surface occupation area is reduced, since the spacings d1 and d2, referenced above, are effectively decreased (to zero). A further advantage of the structure of the present invention is that it decreases latch-up susceptibility by reducing the betas of both NPN and PNP parasitic transistors that may be formed in the structure.

DETAILED DESCRIPTION

Figure 1:
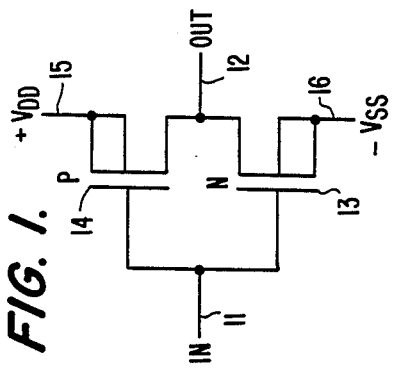
FIG. 1 is a schematic diagram of a CMOS transistor circuit.
Figure 2:
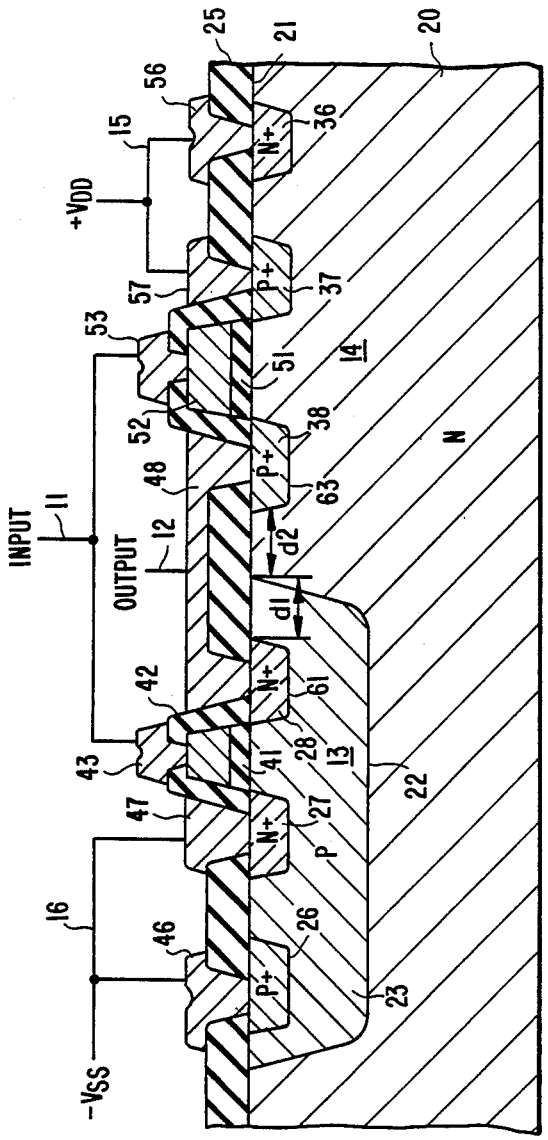
FIG. 2 is a diagrammatic illustration of conventional planar direct moat semiconductor architecture for implementing the CMOS transistor logic circuit of FIG. 1.
Figure 3:
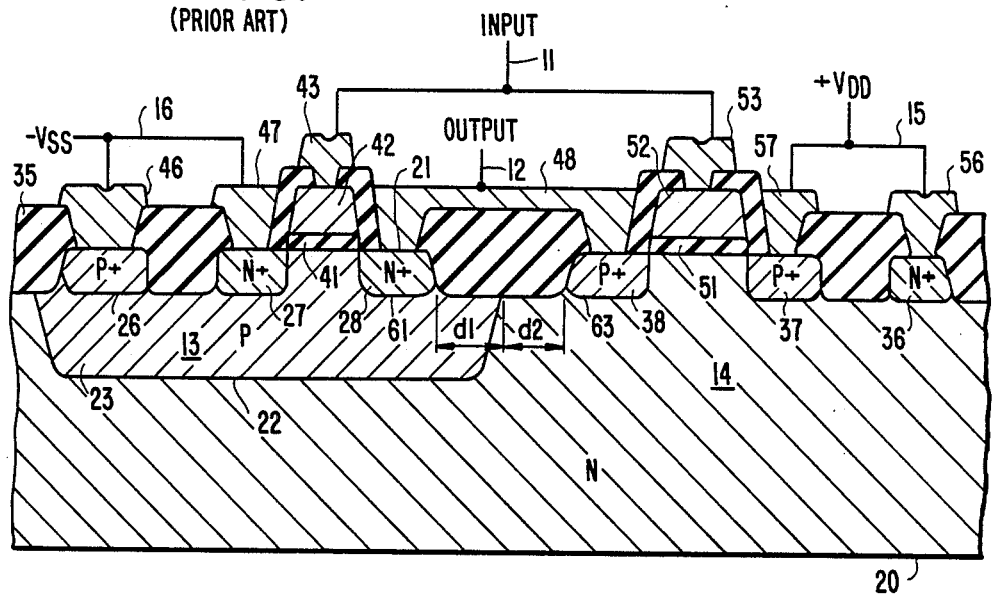
FIG. 3 is a diagrammatic illustration of a conventional non-planar semiconductor architecture, employing recessed oxidation dielectric isolation, for implementing the CMOS transistor circuit of FIG. 1.

Referring now to FIGS. 4A-4E and 5, improved CMOS transistor structures of the present invention, employing a buried dielectric region for eliminating the need for surface spacing of the drain regions of opposite channel conductivity type transistors for a planar semiconductor structure (FIGS. 4A-4E) and a non-planar structure (FIG. 5) employing recessed dielectric isolation, respectively, are shown. Except for the abutting drain regions and the shorting contact layer therefor, as well as the buried dielectric isolation region therebeneath, the architectural configuration of the complementary inverter structures of FIGS. 4A-4E and 5 are respectively identical to those of FIGS. 2 and 3, so that an explanation of the remaining regions and connections is unnecessary and will be omitted.

Figure 4A:
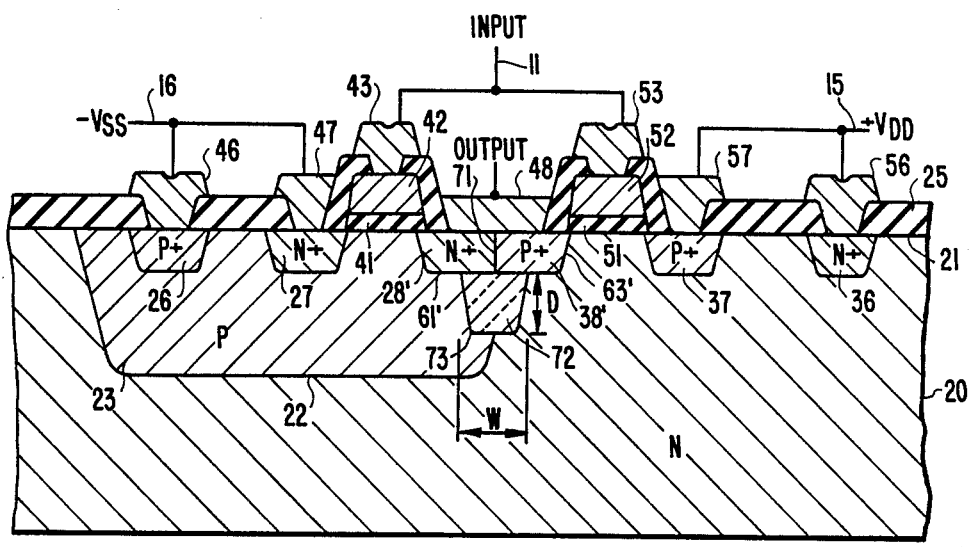
FIG. 4A is a diagrammatic illustration of a planar semiconductor architecture according to the present invention for implementing the CMOS transistor of FIG. 1.
Figure 4B:
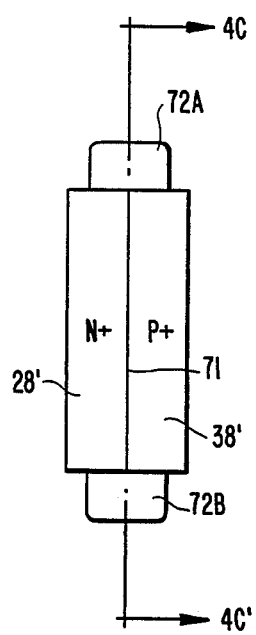
FIG. 4B is a plan view of a portion of a first modified version of the planar semiconductor architecture shown in FIG. 4A, depicting regions 28' and 38' and underlying dielectric layer 72 with extending tabs 72A, 72B.
Figure 4C:
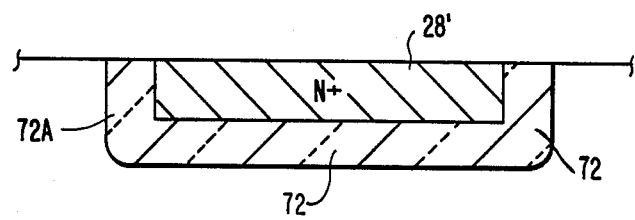
FIG. 4C is a sectional view of that portion of the planar semiconductor architecture shown in FIG. 4B taken along line 4C-4C' thereof.
Figure 4D:
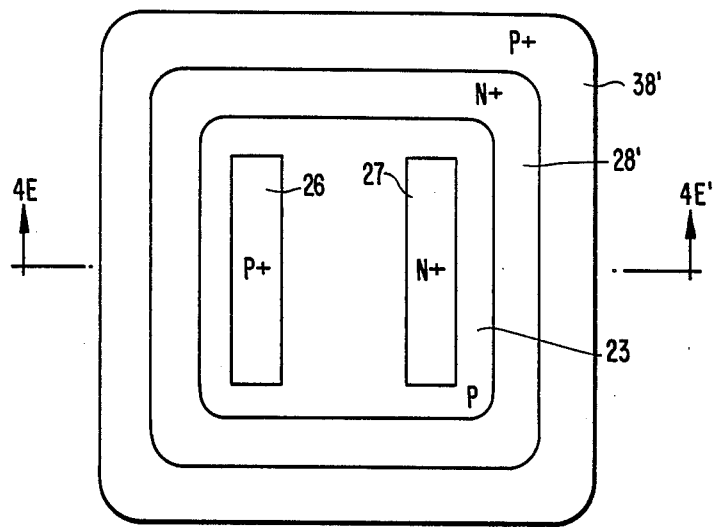
FIG. 4D is a plan view of a portion of a second modified version of the planar semiconductor architecture shown in FIG. 4A, depicting a closed geometry configuration of regions 28' and 38' and underlying dielectric layer 72.
Figure 4E:
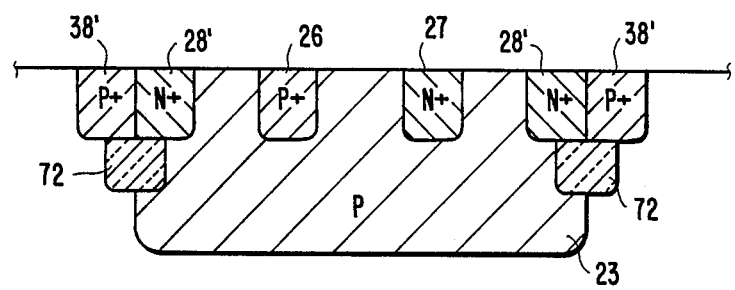
FIG. 4E is a sectional view of the portion of the second modified version of the planar semiconductor architecture shown in FIG. 4D taken along lines 4E-4E' thereof.
Figure 5:
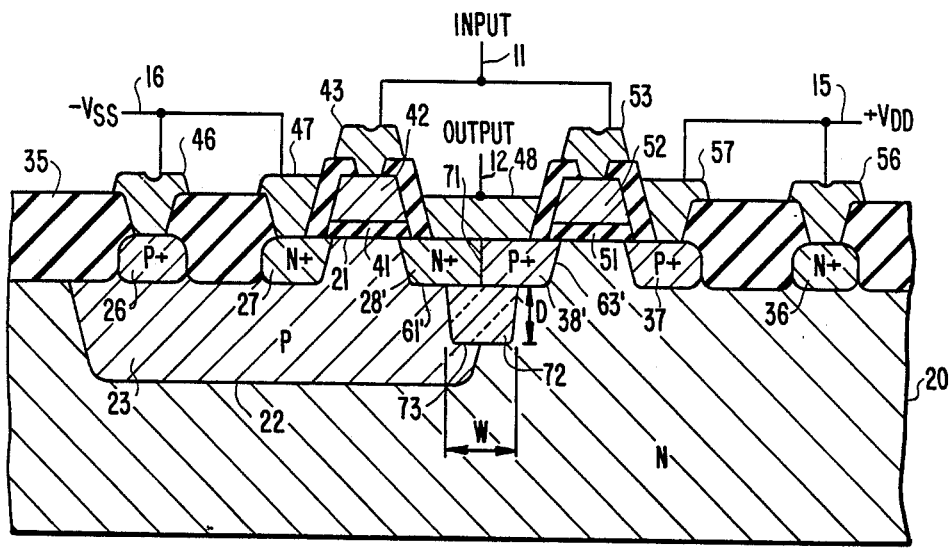
FIG. 5 is a diagrammatic illustration of a non-planar semiconductor architecture according to the present invention employing recessed dielectric isolation, for implementing the CMOS transistor circuit of FIG. 1.

In each of FIGS. 4A-4E and 5, the drain region of the N channel driver transistor 13 is shown as a region 28' formed in a surface portion of the well region 23, so as to extend substantially in alignment with the perimeter of PN junction 22 formed between the well region 23 and the substrate 20 at surface 21 of the substrate. For the P channel transistor 14, P+ drain region 38' is shown as extending from surface 21 to a prescribed depth in the N-type substrate 20 and abutting against drain region 28' of N channel transistor 13 along PN junction 71. This PN junction 71 between respective drain regions 28' and 38' is shorted by an overlying metallic contact layer 48 to which output link 12 is connected. Contiguous with the bottom of each of drain regions 28' and 38' is a buried dielectric layer 72 having a width W and extending to a depth D from the bottom of regions 28' and 38', with PN junction 22 of well region 23 terminating at the bottom 73 of buried dielectric layer 72. The perimeter of the dielectric layer 72, as defined by its width W and depth D, is such as to provide a barrier sufficient to prevent overlap between the depletion region which extends from PN junction 63' toward the depletion region which extends from PN junction 22, and from the depletion region which extends from PN junction 61' and the depletion region which extends from PN junction 22. Where direct moat processing is employed (or for recessed oxide processing where the recess is insufficient), abutting N+ and P+ drains 28' and 38' may not line up directly with junction 22 between well region 23 and substrate 20 at the edges of drain regions 28' and 38'. Sufficient misalignment here may cause either a short between N+ drain region 28' and N-type substrate 20 or between P+ drain region 38' and P-type well region 23, depending upon the direction of the misalignment. A practical solution to this potential fabrication problem may include the provision of end tabs 72A, 72B as extensions of dielectric layer 72, as shown in FIGS. 4B and 4C. Alternatively, a closed geometry configuration, as shown in FIG. 4D and 4E may be employed.

For a substrate having an impurity concentration in a range on the order of $1.3 \times 10^{15}$ cm$^{-3}$ or resistivity in a range on the order of 3-5$\Psi$.cm and P-well region 23 having an impurity concentration in a range on the order of $5 \times 10^{16}$ cm$^{-3}$ and a depth in a range on the order of 1 $\mu$m from the surface 21, the dimensions of dielectric island region 72 may lie in a range of 1 $\mu$m$\leq$W$\leq$2 $\mu$m, 0.5 $\mu$m$\leq$D$\leq$1.0 $\mu$m with respective drain regions 28' and 38' having an impurity concentration range on the order of $1 \times 10^{19}$ cm$^{-3}$ and a depth from the surface of substrate 21 on the order of 0.2 $\mu$m.

Figure 6:
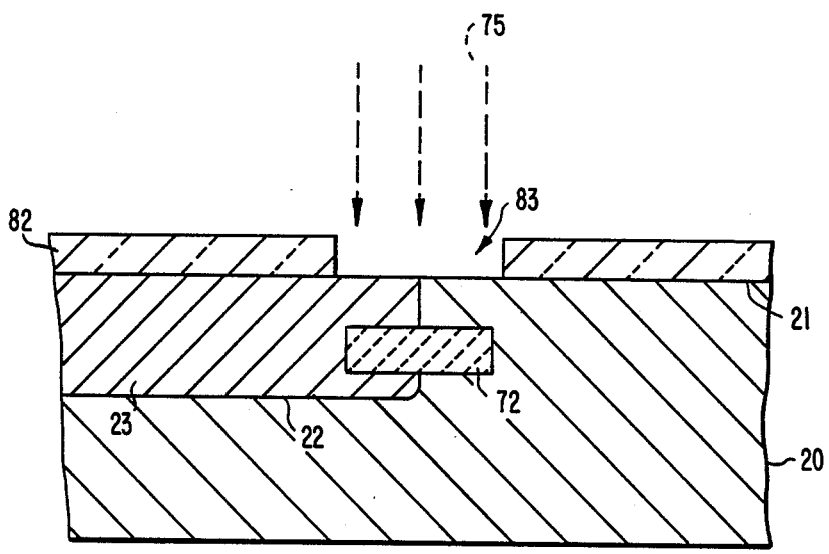
FIG. 6 is a diagrammatic illustration of a portion of the semiconductor architecture of FIG. 4 at that stage of its manufacture in which the buried dielectric layer 72 is formed.

In the course of fabrication of the CMOS structure of the present invention, a preferred technique for forming the buried dielectric island region 72 is to implant oxygen or nitrogen into a (silicon) substrate and convert the implanted oxygen or nitrogen and silicon region into a dielectric layer of silicon dioxide or silicon nitride through a subsequent heat treatment. For this purpose, as shown in FIG. 6, on the surface of the substrate 20, there may be provided an ion implantation mask, such as an oxide layer 82 patterned by conventional lithography and etch techniques, having a window 83 which exposes a portion of the P well region 23 and the substrate 20 whereat the PN junction 22 extends to the surface 21. An implant beam 75 of oxygen or nitrogen is directed onto the device structure through window 83, to form a buried dielectric island region 72 which overlaps the PN junction 22 between the P well region 23 and the substrate 20, as shown. For the parametric range discussed above beam 75 may have an implant energy of 200 keV and a dosage concentration of $2 \times 10^{18}$ cm$^{-2}$. The thickness of the buried dielectric region 72 is such that the electrical characteristics of the PN junction 22 beneath the buried dielectric island region 72 are not significantly affected by changing voltages on the N+ and P+ source regions 28' and 38' to be subsequently introduced into the surface of the substrate directly above the buried dielectric island region 72. Because of the lower permitivity value of silicon dioxide (3.9), as compared with that of silicon nitride (7.0), oxygen is a preferred implant material for forming the buried dielectric island region 72 in silicon. For a given thickness of the dielectric, a lower permitivity means a lower capacitance and therefore a reduced effect due to the changing voltages on the source regions 28' and 38'.

After the buried dielectric island region 72 has been introduced by the implant step, oxide mask layer 82 is removed and the field oxide for the respective P channel and N channel transistors is selectively formed. During this time, the implanted oxygen or nitrogen reacts with the underlying silicon to form the desired buried dielectric region of silicon dioxide or silicon nitride. Thereafter, conventional impurity introduction, passivation and interconnect steps are carried out.

For a more detailed description of the use of implanted oxygen and nitrogen to form a buried dielectric region, attention may be directed to the following articles: G. Zimmer, H. Vogt, "CMOS ON BURIED NITRIDE-A ULSI SOI TECHNOLOGY," IEEE Trans. on Elec. Dev., Vol Ed-30, No. 11, P1515-P1520; A. Hamdi, F. McDaniel, R. Pinizzotto, S. Matteson, H. Lam, D. Malhi, "VLSI MATERIALS: A COMPARISON BETWEEN BURIED OXIDE SOI AND SOS," IEEE trans. on Nuclear Sci. Vol NS-30, No. 2, P1722-P1725; R. Pinizzotto, B Vaandrager, S. Matteson, H. Lam, S. Malhi, A. Hamdi, F. McDaniel, "THE TOP SILICON LAYER OF SOI FORMED BY OXYGEN ION IMPLANTATION", Nuclear Sci. Vol. NS-30, No. 2, P1718-P1721; S. Malhi, H. Lam, R. Pinizzotto, "NOVEL SOI DESIGN USING ULTRA THIN NEAR INTRINSIC SUBSTRATE", in IEDM Dig. Tech P107-P110, 1982; and K. Izumi, Y. Omura, T. Sakai, "SIMOX TECHNOLOGY AND IT APPLICATION CMOS LSIS", Journal of Electronic Materials, Vol 9, No. 5, 1983.

Although the foregoing description has related to the use of a buried dielectric layer for providing isolation between the depletion regions of adjacent complementary transistors of a CMOS transistor pair, the invention may also be employed in other applications where control of the behavior, parameters of adjacent semiconductor regions is desired. For example, the present invention may be used to control the depth of one or more shallow regions and junctions associated therewith.

More particularly, by controlling the depth of the buried dielectric layer from the substrate surface beneath which surface a region of interest is to be formed, the depth of that region from the substrate surface may be controlled. The technique is especially useful where very shallow regions (having a depth in a range on the order of 2000 Å) are to be formed.

Figure 7:
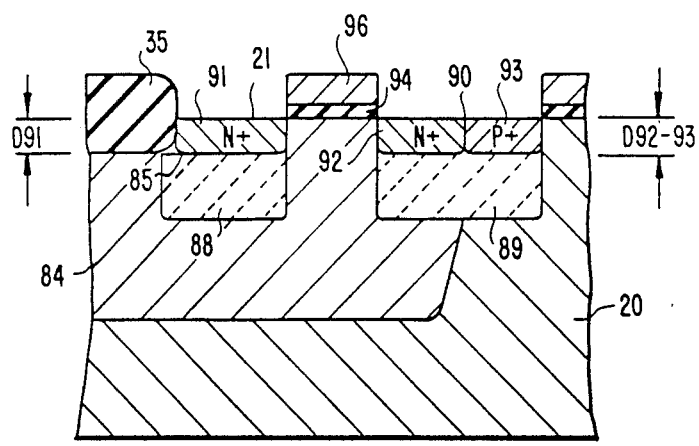
FIG. 7 is a diagrammatic illustration of a semiconductor architecture of the present invention employing a buried dielectric layer for controlling the depth of shallow surface regions.

An example of such a structure employing a buried dielectric layer to control the depth of a shallow junction region is shown in FIG. 7. As illustrated therein a buried dielectric layer 88 is formed in a P-well region 84 which extends to surface 21 of N-type substrate 20. A shallow N+ region 91 extends a depth D91 from surface 21 to the top 85 of buried dielectric layer 88. For the environment of a CMOS transistor pair, such as that described above, N+ region 91 may correspond to N+ source region 27 of N channel transistor 13. A second buried dielectric layer 89 provides the depletion region spread isolation function, described above, and also delimits the depth D92-93 "shallowness" of N+ region 92 and abutting P+ region 93 forming a PN junction 90 therebetween. N+ region 92 may correspond to the drain region 28 of N channel transistor 13, while P+ region 93 may correspond to the P+ region 38 of P channel transistor 14. Overlying the channel of transistor 13 is a thin gate oxide layer 94 atop which is disposed a gate electrode (e.g. polysilicon layer) 96.

Providing a buried dielectric (e.g. silicon dioxide) to control the depth of regions introduced into the substrate 20 from surface 21 results in the creation of a diffusion barrier for the dopants through which the shallow regions are formed. Thus, for example, in the embodiment shown in FIG. 7, the junction depth D92-93 of N+ region 92 and P+ region 93 is determined by the location of the top of buried dielectric layer 89. Junction spiking normally associated with shallow N+ and P+ regions becomes less of a problem because the spikes will not short the N+ and P+ regions to the well 84 or the substrate 20.

Figure 8:
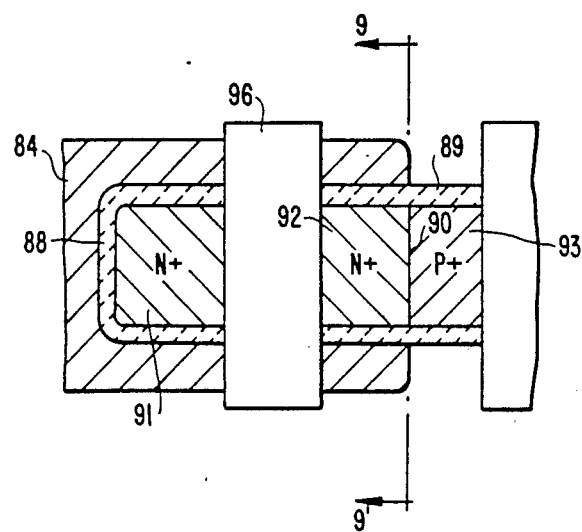
FIG. 8 is a plan view of the semiconductor architecture of FIG. 7.
Figure 9:
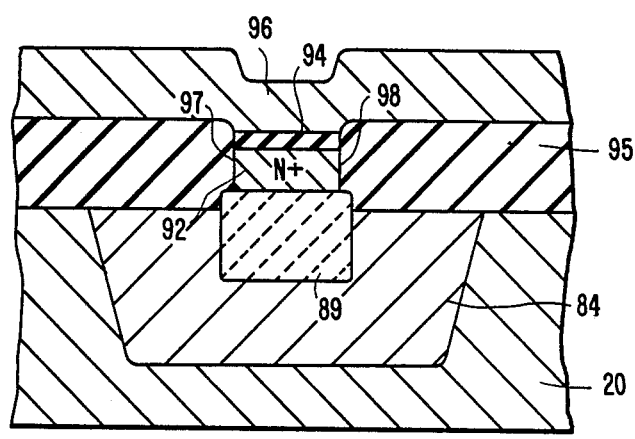
FIG. 9 is a sectional view of the semiconductor architecture of FIGS. 7 and 8 taken along lines 9-9' FIG. 8.

In order to control (the depth of a shallow surface region, such as regions 92 and 93 of the complementary structure shown in FIG. 7, buried dielectric layer 89 must completely underlie the area where the surface regions are formed. FIG. 8 shows a plan view of such a disposition of the buried dielectric layer 89 of FIG. 7, while FIG. 9 shows a cross-sectional view taken along line 9-9' of FIG. 8. In the illustration of FIG. 9, a field oxide layer 95 is shown as abutting the sides 97 and 98 of N+ region 92 and being contiguous with buried dielectric layer 89.

In the case where the buried dielectric region 89 is formed by ion implantation, the depth and width of the region may be controlled by the selection of implantation energy and dose, since, as is commonly known by those familiar with the technology, the projected range of the implanted species (that is, the mean depth of the implant distribution) and the thickness of the implanted region are direct functions of the implant energy. For example, a dose of 2E18 at 165 KeV yields an oxide dielectric of about 4,000 Å thickness and 1,500 Å depth, as reported by K. Hashimoto, T. I. Kamins, K. M. Cham, and S. Y. Chaing, "Characteristics of Submicrometer CMOS Transistors in Implanted-Buried-Oxide SOI Films," in IEDM Tech. Dig., P672–P675, 1985. Deeper and thicker dielectric regions may be formed by using a higher energy with a proportionate increase in dose. In the most general case, multiple implants may be used with the least energetic implant setting the depth of the buried dielectric, and the most energetic then setting the thickness of the resulting continuous dielectric region. By such methods, depths on the order of hundreds of angstroms can be achieved with thicknesses up to a few thousand angstroms. The shallow depth limits the drain doping penetration into the bulk and so minimizes the short channel effects resulting from two dimensional characteristics of the drain region. The dielectric thickness supplants the previously described depletion regions and blocks the unwanted leakage currents. Since the grown oxide dielectric has been shown to be of quality comparable to thermally grown, the breakdown voltage of the dielectric will exceed 1 volt per nanometer.

In lieu of implanting oxygen or nitrogen and the subsequently heating the buried dielectric layer to form the silicon nitride or the silicon oxide material, the processing methodology by way of which the CMOS structure of the present invention is achieved may employ ion beam lithography through which the semiconductor material where the dielectric material is to be formed is removed. Thereafter, the dielectric layer is formed in the region of the removed material. Subsequently through semiconductor refill and selective impurity introduction, the respective drain regions 28' and 29' are formed over the thus formed dielectric layer.

As will be appreciated from the foregoing description of the present invention, through the use of a buried dielectric island region, the depth of doped regions may be controlled. Also, the buried dielectric layer effectively isolates the PN junctions formed between the sources of the opposite channel conductivity type transistors and the semiconductor material in which they are formed from the PN junction between the well region and the substrate in which the well region is formed, the effect of the separation between the drain regions of the opposite channel conductivity type transistors of conventional structures is achieved, namely separation between the depletion regions is achieved, yet the disadvantages of increased wiring length and parasitic capacitance are obviated, since the drain regions of the transistors directly abut one another, thereby eliminating the spacing therebetween.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A semiconductor device comprising:
   a semiconductor substrate of a first conductivity type;
   a first semiconductor region of a second conductivity type opposite to said first conductivity type formed in a first surface portion of said substrate and defining a first junction with said substrate;
   a second semiconductor region of said first conductivity type formed in a first surface portion of said first semiconductor region and defining therewith a second junction;
   a third semiconductor region of said second conductivity type formed in a second surface portion of said substrate and defining therewith a third junction and being contiguous with said second semiconductor region so as to define therewith a fourth junction; and
   a dielectic insulator layer interposed in said substrate between said first junction and each of said second, third and fourth junctions, said dielectric insulator layer being contiguous with the bottom and side portions of each of said a second and third semiconductor regions, and extending to a top surface of said substrate, so as to effectively completely insulate said fourth junction from semiconductor material adjacent to either of said second and third semiconductor regions.

2. A semiconductor device according to claim 1, wherein said first junction terminates at said dielectric insulator layer.

3. A semiconductor device according to claim 1, wherein said second junction terminates at said dielectric insulator layer.

4. A semiconductor device according to claim 1, wherein said third junction terminates at said dielectric insulator layer.

5. A semiconductor device according to claim 1, further including means for effectively shorting said fourth junction.

6. A semiconductor device according to claim 1, wherein each of said second and third semiconductor regions respectively forms one of the source/drain regions of complementary field effect transistors disposed in said substrate.

7. A complementary field effect transistor device comprising;
   a semiconductor substrate of a first conductivity type having formed therein a well region of a second conductivity type and defining therewith a first junction;
   a first field effect transistor of a first channel conductivity type comprising respective source and drain regions of said first conductivity type formed in said well region, a first gate insulator layer overlying said well region between said source and drain regions of said first conductivity type, and a first gate overlying said first gate insulator layer;
   a second field effect transistor of a second channel conductivity type comprising respective source and drain regions of said second conductivity type formed in said substrate, a second gate insulator layer overlying said substrate between said source and rain regions of said second conductivity type, a second gate overlying said second gate insulator layer; and wherein one of said source and drain regions of said first conductivity type is contiguous with one or the source and drain regions of said second conductivity type so as to define therewith a second junction; and further including a dielectric insulator region disposed in said substrate beneath and contiguous with the contiguous ones of said source and drain regions, said dielectric layer being contiguous with the bottom and side portions of each of the contiguous ones of said source and drain regions and extending to a top surface of said substrate so as to effectively completely insulate said second junction from semiconductor material adjacent to either of said contiguous ones of said source and drain regions.

8. A complementary field effect transistor device according to claim 7, further including means for connecting said contiguous ones of said source and drain regions in common.

9. A complementary field effect transistor device according to claim 8, further including means for connecting said first and second gates in common.

10. A complementary field effect transistor device according to claim 7, wherein said first junction terminates at the bottom of said dielectric insulator region.

11. A semiconductor device according to claim 1, wherein said dielectric insulator layer completely underlies said second and third semiconductor regions.

12. A complementary field effect transistor device comprising:

a semiconductor substrate of a first conductivity type having a first surface portion thereof a first field effect transistor including source and drain regions of a second conductivity type, opposite to said first conductivity type, forming with said substrate respective first and second junctions;

a well region of said second conductivity type formed in a second surface portion of said substrate adjacent to said first surface portion thereof, said well region forming with said substrate a third junction and having therein a second field effect transistor including source and drain regions of said first conductivity type forming therewith fourth and fifth junctions; and a dielectric insulator region disposed in said substrate so as to be interposed between said third junction and each of said first and second junctions and each of said fourth and fifth junctions; and wherein one of the source and drain regions of said first conductivity type is contiguous with one of the source and drain regions of said second conductivity type so as to form therewith a sixth junction, and wherein said dielectric insulator layer is contiguous with the bottom and side portions of said contiguous ones of said source and drain regions and extends to a top surface of said semiconductor substrate, so as to effectively completely insulate said sixth junction from semiconductor material adjacent to said one of the source and drain regions of said first conductivity type and said one of the source and drain regions of said second conductivity type.

13. A complementary field effect transistor device according to claim 12, wherein said dielectric insulator layer complementary underlies the contiguous ones of said source and drain regions.

14. A complementary field effect transistor device according to claim 7, wherein in said dielectric insulator layer completely underlies the contiguous ones of said source and drain regions.

15. A complementary field effect transistor device according to claim 12, further including means for effectively shorting the interface between the contiguous ones of said source and drain regions.

16. A complementary field effect transistor device according to claim 12, wherein said third junction terminates at said layer of dielectric insulator region.

17. A complementary field effect transistor device according to claim 16, wherein said third junction terminates at the bottom of said dielectric insulator region.

* * * * *